US012596146B2

(12) United States Patent
Amada et al.

(10) Patent No.: US 12,596,146 B2
(45) Date of Patent: Apr. 7, 2026

(54) SOCKET, JIG, SOCKET MAINTENANCE SET, AND DISASSEMBLY METHOD

(71) Applicant: YOKOWO CO., LTD., Tokyo (JP)

(72) Inventors: Kohei Amada, Tomioka (JP); Yuki Matsui, Tomioka (JP); Yoshinori Shirai, Tomioka (JP); Yuta Yamato, Tomioka (JP); Suguru Matsui, Tomioka (JP); Taku Kitsunai, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 154 days.

(21) Appl. No.: 18/291,662

(22) PCT Filed: Jun. 10, 2022

(86) PCT No.: PCT/JP2022/023442
§ 371 (c)(1),
(2) Date: Jan. 24, 2024

(87) PCT Pub. No.: WO2023/007963
PCT Pub. Date: Feb. 2, 2023

(65) Prior Publication Data

US 2024/0241172 A1 Jul. 18, 2024

(30) Foreign Application Priority Data

Jul. 26, 2021 (JP) ................................ 2021-121399

(51) Int. Cl.

| | |
|---|---|
| ***G01R 31/28*** | (2006.01) |
| ***G01R 1/04*** | (2006.01) |
| ***H01R 33/76*** | (2006.01) |

(52) U.S. Cl.
CPC ....... *G01R 31/2886* (2013.01); *G01R 1/0466* (2013.01); *H01R 33/76* (2013.01); *H01R 2201/20* (2013.01)

(58) Field of Classification Search
CPC .. G01R 31/2886; G01R 1/0466; H01R 33/76; H01R 2201/20
See application file for complete search history.

(56) References Cited

U.S. PATENT DOCUMENTS

| | | | | |
|---|---|---|---|---|
| 5,923,181 | A * | 7/1999 | Beilstein, Jr. ...... | G01R 31/2886 324/750.19 |
| 2009/0230983 | A1 * | 9/2009 | Yoshida ............... | G01R 1/0466 324/756.02 |
| 2012/0142210 | A1 * | 6/2012 | Di Stefano ............. | H01R 4/48 439/700 |
| 2016/0313371 | A1 | 10/2016 | Harada et al. | |

FOREIGN PATENT DOCUMENTS

| | | | |
|---|---|---|---|
| CN | 101540465 | B | 11/2010 |
| JP | 2016-207511 | A | 12/2016 |

* cited by examiner

*Primary Examiner* — Paresh Patel
(74) *Attorney, Agent, or Firm* — XSENSUS LLP

(57) ABSTRACT

A socket includes a pin block configured to hold a contact probe array, and a pin plate that removably engages with the pin block. The pin block includes a curved portion located outside the contact probe array and convex toward an inside of the contact probe array. The pin plate includes an engagement portion that engages with the curved portion convex toward the inside.

13 Claims, 9 Drawing Sheets

SOCKET, JIG, SOCKET MAINTENANCE SET, AND DISASSEMBLY METHOD

CROSS-REFERENCE TO RELATED APPLICATIONS

The present application is based on PCT filing PCT/JP2022/023442, filed Jun. 10, 2022, which claims priority from Japanese Patent Application No. 2021-121399, filed Jul. 26, 2021, the disclosure of each is incorporated herein in its entirety by reference.

TECHNICAL FIELD

The present invention relates to a socket and the like used for inspection of an IC package.

BACKGROUND ART

A socket used for inspection of an IC package is known (for example, see Patent Literature 1). The socket includes a pin block in which a plurality of contact probes each corresponding to a respective one of electrode terminals of an IC are provided upright, and a pin plate that supports the contact probes together with the pin block. The pin block and the pin plate are fixed with a screw. The IC package to be inspected is guided over the contact probe in a predetermined posture. By appropriately pressing the guided IC package from above to below, the electrode terminals of the IC package come into contact with the contact probes, and a current conducting path for inspection is secured.

CITATION LIST

Patent Literature

Patent Literature 1: JP2016-207511A

SUMMARY OF INVENTION

Technical Problem

In recent years, in an inspection apparatus for an IC package using a contact probe, in order to improve the high frequency characteristics of the electrical connection between the contact probe and the IC package, the overall length of the contact probe tends to be shortened. When the overall length of the contact probe is shortened, the thickness of the socket holding the contact probe is required to be reduced. That is, it is also required to adapt to a holding structure of the contact probe such as a pin block or a pin plate constituting the socket.

When the thickness of the pin block or the pin plate is reduced, for example, further improvement in workability of disassembling and assembling the pin block and the pin plate when the contact probe is detached from the socket and replaced is also required.

An example of an object of the present invention is to provide a socket corresponding to a contact probe having a small overall length, a jig related to the socket, a socket maintenance set, and a method for disassembling the socket.

Solution to Problem

An aspect of the present invention provides a socket including a pin block configured to hold a contact probe array, and a pin plate that removably engages with the pin block. The pin block includes a curved portion located outside the contact probe array and convex toward an inside of the contact probe array. The pin plate includes an engagement portion that engages with the curved portion convex toward the inside.

According to this aspect, engagement between the pin block and the pin plate can be achieved without using a screw. Since no screw is required, the socket can be made thinner accordingly. Therefore, it is possible to provide a socket that is thinner than a socket in the related art and that corresponds to a contact probe having a small overall length.

DESCRIPTION OF EMBODIMENTS

Hereinafter, an example of an embodiment will be described to which the present invention is applied, but forms to which the present invention can be applied are not limited to the following aspects. Each figure shows three right-handed orthogonal axes (X, Y, Z) to indicate a common direction. Some figures show three left-handed orthogonal axes (Xs, Ys, Zs) indicating directions for a socket. In the following description, it will be assumed that an X axis direction and an Xs axis direction are parallel, a Y axis direction and a Ys axis direction are parallel, and a Z axis direction and a Zs axis direction are exactly opposite. The description will be given assuming that an X axis positive direction and an Xs axis positive direction are the front, an X negative direction and an Xs axis negative direction are the rear, a Y axis positive direction and a Ys axis positive direction are the left, a Y axis negative direction and a Ys axis negative direction are the right. The description will be given assuming that a Z axis positive direction is the top for a socket maintenance set 10 and a jig 70, a Zs axis positive direction is the top for a socket 20, a Z axis negative direction is the bottom for the socket maintenance set 10 and the jig 70, and a Zs axis negative direction is the bottom for the socket 20.

Figure 1:
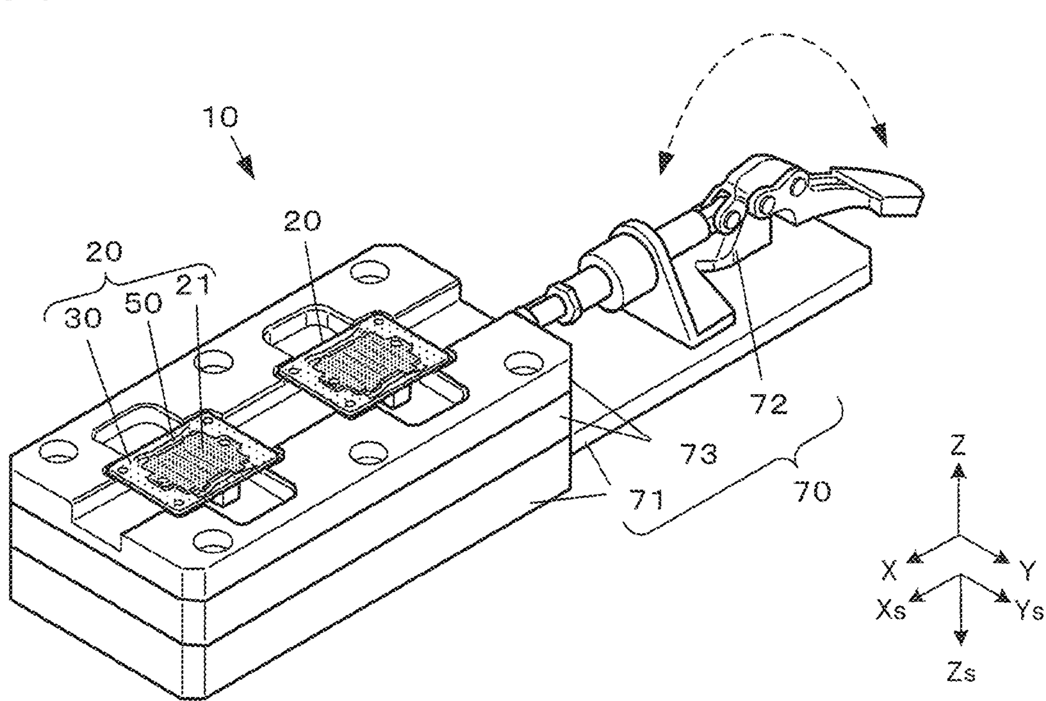
FIG. 1 is a perspective external view showing an example of a configuration of a socket maintenance set.

FIG. 1 is a perspective external view showing an example of a configuration of the socket maintenance set 10.

The socket maintenance set 10 includes the socket 20 and the jig 70 that supports a disassembly operation of the socket 20.

The socket 20 includes a contact probe array 21, a pin block 30, and a pin plate 50. The jig 70 includes a base 71, a toggle clamp 72 fixed to the base 71, and a disassembly mechanism portion 73 formed on the base 71. An operator simultaneously attaches the two sockets 20 to the one jig 70. Then, it is possible to collectively and simultaneously perform a disassembly operation of releasing an assembled state of the pin block 30 and the pin plate 50 for the two sockets 20 by one operation of the jig 70. The socket 20 is attached to the jig 70 in a posture in which the pin plate 50 in a state shown in FIG. 2 is oriented in the Zs axis positive direction at an attachment position of the jig 70 shown in FIG. 1.

First, the socket 20 will be described in detail.

Figure 2:
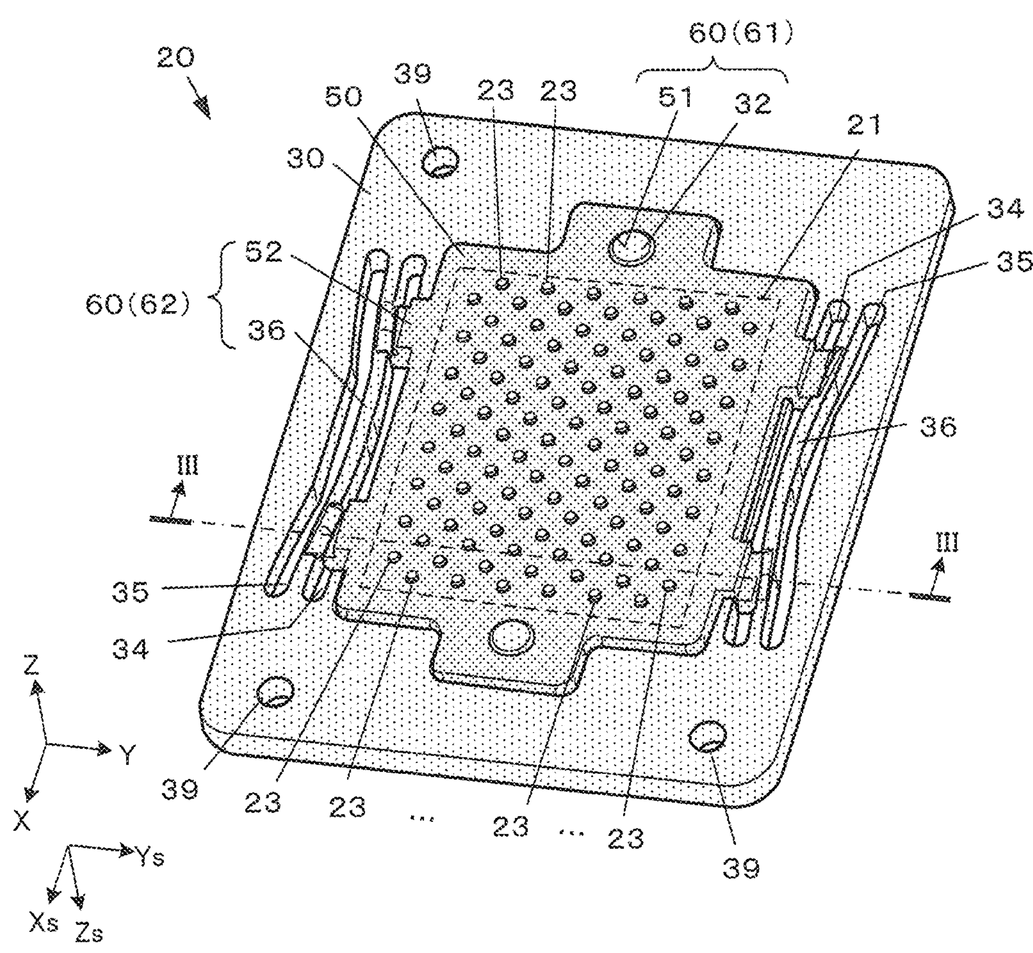
FIG. 2 is a perspective external view showing a configuration example of a socket.
Figure 3:
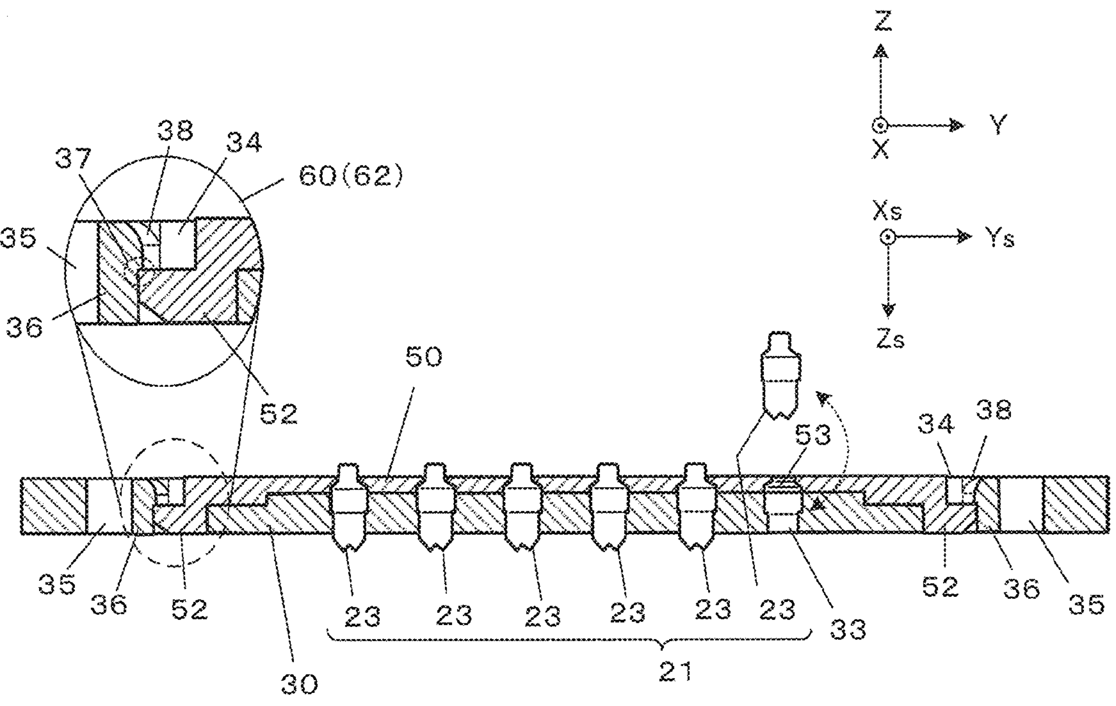
FIG. 3 is a cross-sectional view taken along a line III-III in FIG. 2.

FIG. 2 is a perspective external view showing a configuration example of the socket 20, and is a view of the socket 20 as viewed from diagonally below. FIG. 3 is a cross-sectional view of a III-III cross section (a Ys-Zs plane) in FIG. 2 as viewed from an Xs axis positive side. FIG. 3 includes a drawn-out enlarged view of a portion surrounded by a long dashed line.

As shown in FIGS. 2 and 3, the socket 20 includes the pin block 30 that holds a plurality of contact probes 23 and the pin plate 50 attached to a lower surface side of the pin block 30. The plurality of contact probes 23 can be referred to as the contact probe array 21. The contact probes 23 are inserted into insertion holes arranged in a planar shape in the pin block 30, and the inserted contact probes 23 are held by the pin block 30.

Both the pin block 30 and the pin plate 50 are plate-shaped components made of a synthetic resin having insulation and elasticity. The pin block 30 and the pin plate 50 have a mutual engagement structure 60 including a first structure portion 61 and a second structure portion 62. The pin block 30 and the pin plate 50 are coupled to each other by the mutual engagement structure 60.

The first structure portion 61 is a structure that determines a relative position of the pin block 30 and the pin plate 50 in a plane direction (a direction parallel to an Xs-Ys plane) intersecting an attachment and detachment direction (a Zs axis direction), and that prevents positional deviation between the pin block 30 and the pin plate 50. Specifically, the first structure portion 61 includes a positioning pin 32 of the pin block 30 and a positioning hole 51 of the pin plate 50.

The relative position between the pin block 30 and the pin plate 50 is determined by inserting the positioning pin 32 of the first structure portion 61 into the positioning hole 51, and a pin block side insertion portion 33 of the pin block 30 and a pin plate side insertion portion 53 of the pin plate 50 have a relative positional relationship in which the pin block side insertion portion 33 and the pin plate side insertion portion 53 face each other one to one in an upper-lower direction (a Z-Zs axis direction). One contact probe 23 is accommodated in each space defined by the pin block side insertion portion 33 and the pin plate side insertion portion 53 facing each other in the relative positional relationship. The contact probe 23 is held by the pin block 30 and the pin plate 50.

The second structure portion 62 is a structure in which the pin block 30 and the pin plate 50 are engaged with each other in the attachment and detachment direction (the Zs axis direction). The second structure portion 62 includes a curved portion 36 of the pin block 30 and an engagement portion 52 of the pin plate 50. The curved portion 36 is a portion formed between an inner cavity 34 and an outer cavity 35, which have two slot shapes. The engagement portion 52 has an engagement step portion 37 that engages with the curved portion 36. The curved portion 36 wraps around above the curved portion 36 (in the Z axis direction) from the Zs axis direction in FIG. 3 and engages with the engagement step portion 37. Then, the engagement of the pin block 30 and the pin plate 50 by the second structure portion 62 is established, and the relative position between the pin block 30 and the pin plate 50 is prevented from deviating in the Zs axis direction. A guide slope 38 of the curved portion 36 assists in assembling the pin plate 50 to the pin block 30 and establishing the engagement by the second structure portion 62.

The pin plate 50 is assembled to the pin block 30 by the first structure portion 61 and the second structure portion 62. The socket 20 holding the contact probe array 21 by the pin block 30 to which the pin plate 50 is assembled is attached to the jig 70 at a predetermined position through the positioning hole 39 (see FIG. 2) formed in the pin block 30. In FIG. 2, three positioning holes 39 are formed at corners of the pin block 30. The present invention is not limited to this, and for example, two positioning holes 39 may be formed in the X axis direction passing through the positioning hole 51 of the pin plate 50 in the pin block 30.

Next, the pin block 30 will be described in detail.

Figure 4:
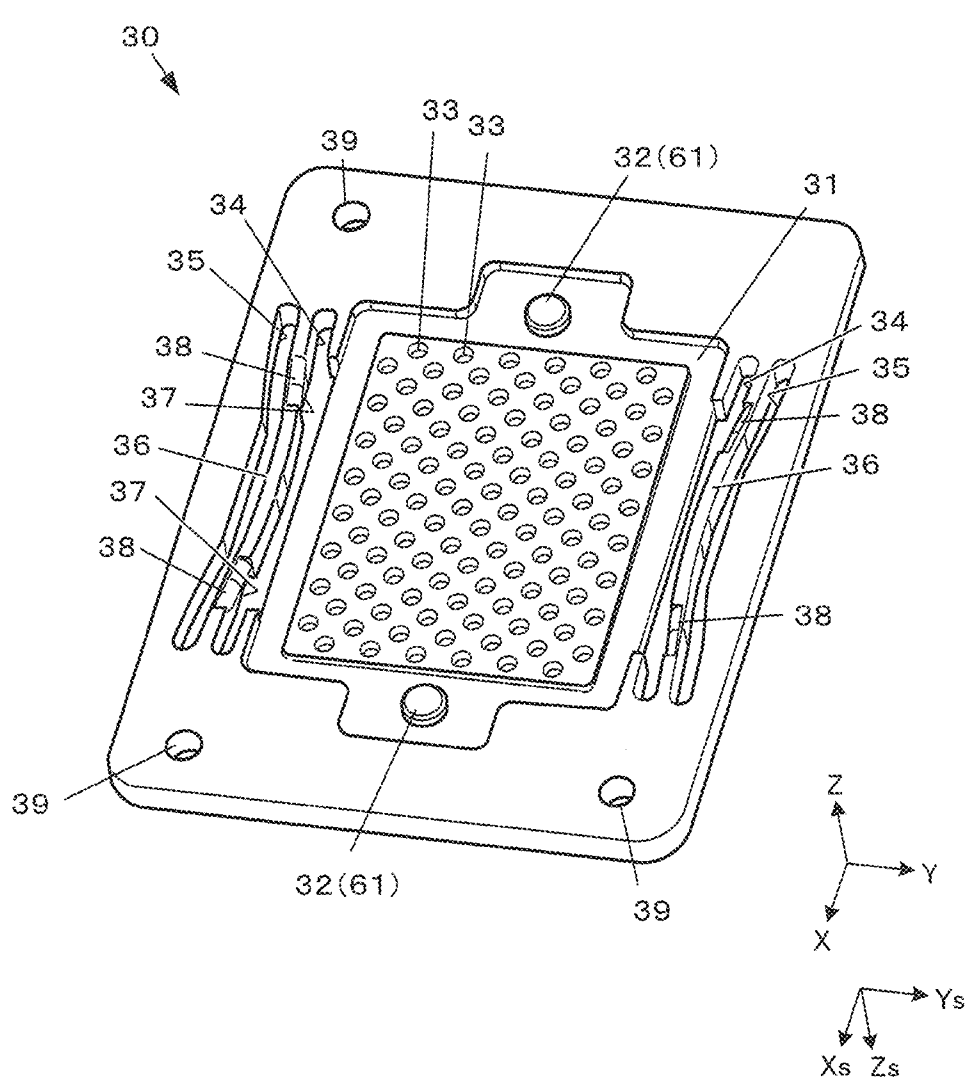
FIG. 4 is a perspective external view (part 1) showing a configuration example of a pin block.
Figure 5:
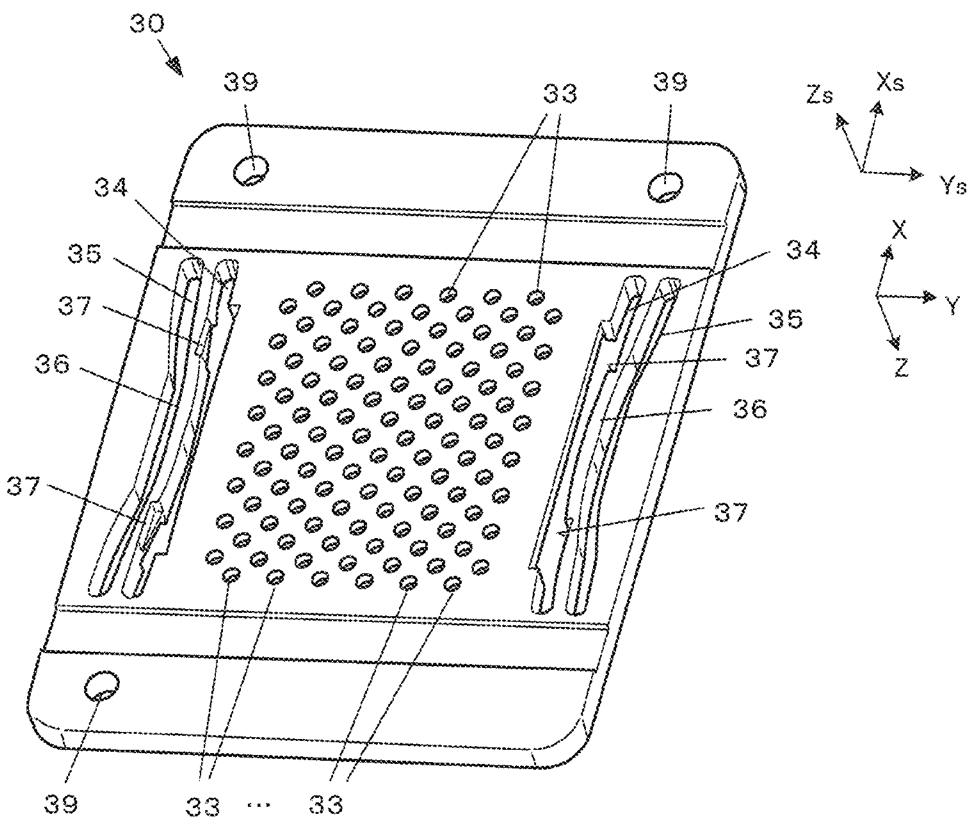
FIG. 5 is a perspective external view (part 2) showing the configuration example of the pin block.

FIG. 4 is a perspective external view showing a configuration example of the pin block 30, and is a view seen from the same viewpoint as FIG. 2, that is, from diagonally below. FIG. 4 is a view in which the pin plate 50 is omitted from FIG. 2. FIG. 5 is a perspective external view showing a configuration example of the pin block 30, and is a view seen from diagonally above.

As shown in FIGS. 4 and 5, the pin block 30 is a substantially rectangular plate-shaped component having four lateral sides. The pin block 30 has a central recess 31 at the center of a lower surface at which the plate thickness (the dimension in the Zs direction) is smaller than that of an outer peripheral portion. The central recess 31 is provided with the positioning pin 32 protruding downward and a plurality of the pin block side insertion portions 33 for inserting and accommodating the contact probe 23.

The plurality of pin block side insertion portions 33 are located in the central recess 31 and are collectively formed as a step portion that is one step higher. The pin block side insertion portions 33 are upper and lower through holes each formed corresponding to a respective one of the contact probes 23 (see FIG. 3) constituting the contact probe array 21, into which upper parts of the contact probes 23 are inserted. The inner shape of the pin block side insertion portion 33 can be set to a shape that can prevent the contact probe 23 from coming off.

The pin block 30 has the inner cavity 34 and the outer cavity 35 on the outside of the central recess 31 on the positive side in the Ys direction and the outside of the central recess 31 on the negative side in the Ys direction, respectively. The inner cavity 34 and the outer cavity 35 have a slot shape elongated in the Xs axis direction. The curved portion 36 like a bridge that bridges an Xs axis positive side and an Xs axis negative side is formed between the inner cavity 34 and the outer cavity 35.

When viewed from the Zs direction, the curved portion 36 has an arc shape curved in the direction parallel to the Xs-Ys plane, and has a curved arc shape that draws a convex arc toward the contact probe array 21 (or toward the center (the inside) of the pin block 30). The curved portion 36 includes the engagement step portion 37 and the guide slope 38 at both end portions in a longitudinal direction along the Xs axis in a front and back positional relationship in a Z-Zs axis direction. When the assembled state of the pin block 30 and the pin plate 50 is disassembled, the convexity of the curved portion 36 changes (deforms) against an elastic force in a direction opposite to the convexity of the curved portion 36 by the jig 70 to be described later. When the curved portion 36 is substantially parallel to the lateral side of the pin block 30, the engaged state between the pin block 30 and the pin plate 50 is released. That is, by forming the curved portion 36 into a curved arc shape that draws a convex arc toward the center of the pin block 30, the pin block 30 and the pin plate 50 can be assembled without increasing the lateral width (the width in the Ys axis direction) of the pin block 30.

The engagement step portions 37 are provided on an upper surface side of the curved portion 36 and at both end portions of the curved portion 36 in the longitudinal direction, and are portions that engage with the engagement portion 52 (see FIG. 3) of the pin plate 50. Since the curved portion 36 has an arc shape, when viewed from a Zs axis positive side (an upper side for the socket 20), the engagement step portion 37 has a triangular step (see FIG. 5) That is, the engagement portion 52 of the pin plate 50 is provided substantially parallel to the lateral side of the pin plate 50, and the engagement portion 52 engages with the engagement step portion 37 in this substantially parallel state. Therefore, a suitable shape for the engagement step portion 37 formed on the arcuate curved portion 36 is a triangular shape when the engagement step portion 37 is viewed from a Zs positive side (the upper side for the socket 20).

The guide slope 38 is a slope facing inward on a lower surface side of the curved portion 36 and at both end portions of the curved portion 36 in the longitudinal direction, and is a slope that guides the engagement portion 52 to the engagement step portion 37. The slope has a substantially R shape (a convex curved surface). Specifically, when the pin plate 50 is assembled to the pin block 30, the operator presses the pin plate 50 against a lower surface of the pin block 30. The engagement portion 52 of the pin plate 50 hits the guide slope 38, and is elastically deformed toward the inner cavity 34 by sliding on the guide slope 38 due to an assembly force. The elastically deformed engagement portion 52 eventually passes through the inner cavity 34 and wraps around the upper surface side of the curved portion 36, the elastic deformation is restored, and the engagement portion 52 engages with the engagement step portion 37.

Next, the pin plate 50 will be described in detail.

Figure 6:
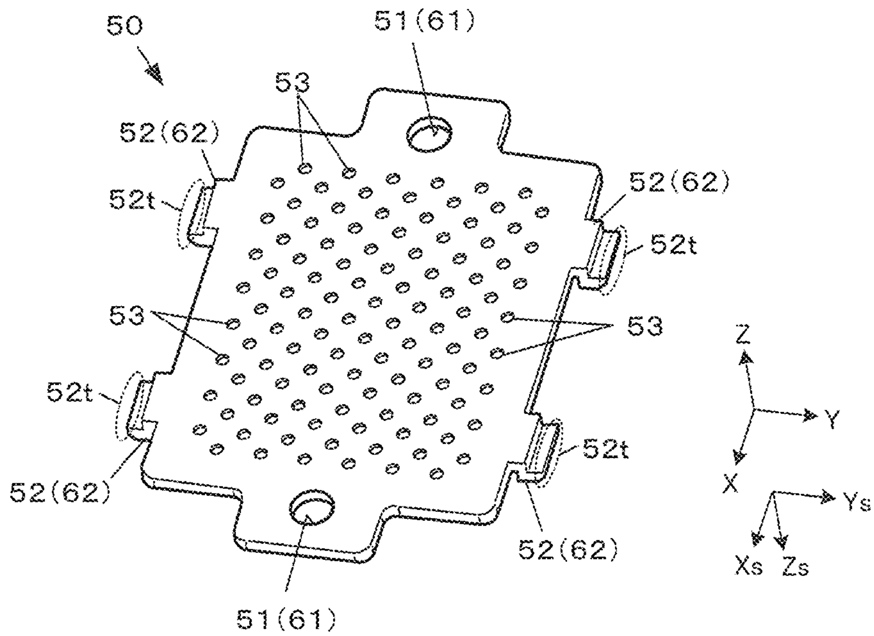
FIG. 6 is a perspective external view (part 1) showing a configuration example of a pin plate.
Figure 7:
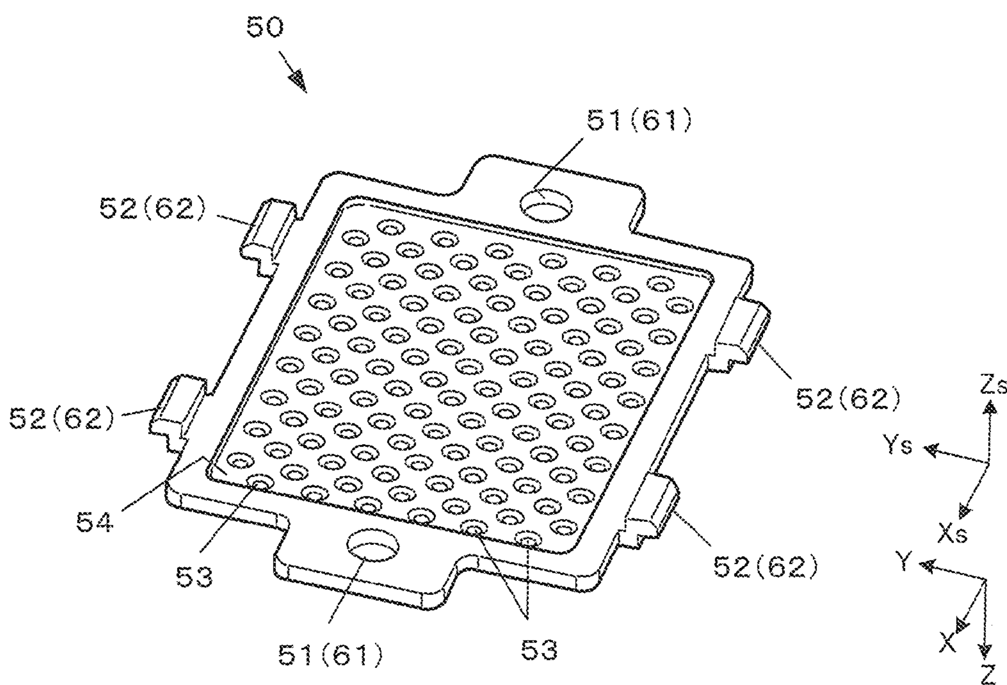
FIG. 7 is a perspective external view (part 2) showing the configuration example of the pin plate.

FIG. 6 is a perspective external view showing a configuration example of the pin plate 50, and is a view seen from the same viewpoint as FIG. 2, that is, from diagonally below. FIG. 6 is a view in which the pin block 30 is omitted from FIG. 2. FIG. 7 is a perspective external view showing a configuration example of the pin plate 50, and is a view of the pin plate 50 as viewed from diagonally above.

As shown in FIGS. 6 and 7, the pin plate 50 is a substantially rectangular plate-shaped component having four lateral sides. The pin plate 50 is formed by arranging, in the central recess 54 thinner than an outer edge portion, the plurality of pin plate side insertion portions 53 each corresponding to a respective one of the contact probes 23 in a central flat plate portion in a plane shape. The pin plate side insertion portions 53 are upper and lower through holes, into which lower parts of the contact probes 23 are inserted. The inner shape of the pin plate side insertion portion 53 can be set to a shape that can prevent the contact probe 23 from coming off.

The pin plate 50 has the positioning holes 51 on the Xs axis positive side of the flat plate portion and the Xs axis negative side of the flat plate portion. The pin plate 50 includes two engagement portions 52 on a side surface of the pin plate 50 on a Ys axis positive side and a side surface of the pin plate 50 on a Ys axis negative side.

Two engagement portions 52 are hook-shaped portions that are provided on each of two opposing lateral sides facing in the Ys axis positive direction and the Ys axis negative direction and that extend upward (in the Zs axis positive direction). A lower surface of an extension end 52*t* (an end portion) of the engagement portion 52 functions as the second structure portion 62 by engaging with the engagement step portion 37 in a direction perpendicular to the attachment and detachment direction (the Zs axis direction) in a manner of being hooked from above (see FIG. 3).

Next, the jig 70 will be described.

Figure 8:
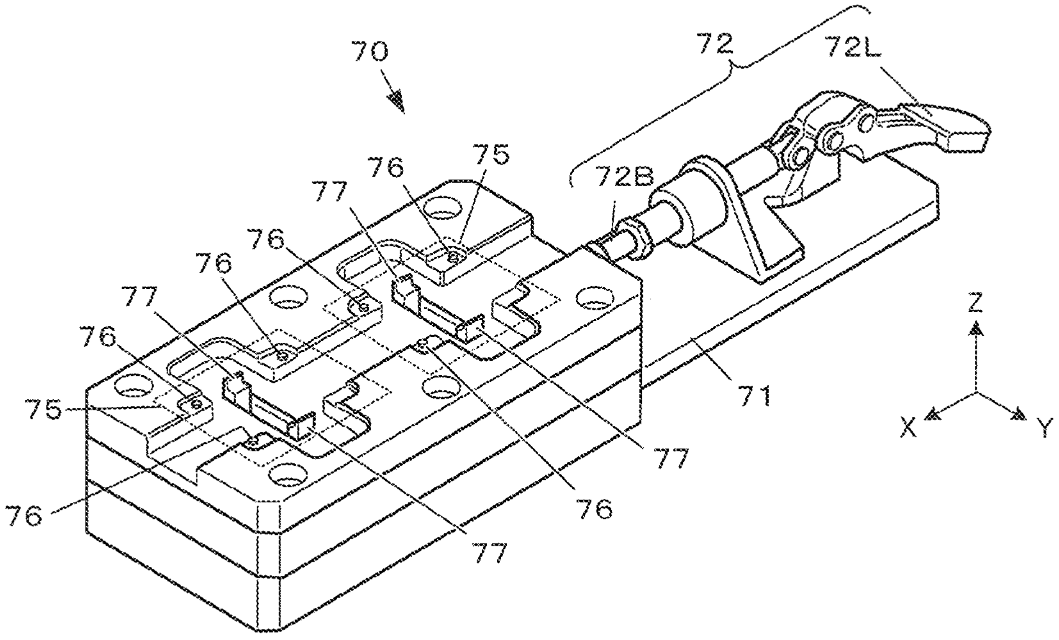
FIG. 8 is a perspective external view showing a configuration example of a jig.

FIG. 8 is a perspective external view showing a configuration example of the jig 70.

The toggle clamp 72 is of a horizontal push type, and when an operation lever 72L is operated, a slide bar 72B is pushed into the disassembly mechanism portion 73 (see FIG. 9) from an X axis negative side toward an X axis positive side.

The jig 70 includes placement portions 75 at two locations on an upper surface (a surface on a Z axis positive side) of the disassembly mechanism portion 73. The placement portion 75 (a range surrounded by a thin dashed line in FIG. 8) is a recess into which the socket 20 is fitted such that the Xs-Ys plane is aligned with an X-Y plane of the jig 70 and the Xs axis of the socket 20 is aligned with the X axis of the jig. The placement portion 75 has four recesses on which four corners of the socket 20 are placed, and positioning protrusions 76 are provided in some of the recesses.

The positioning protrusion 76 is a protrusion that fits into the positioning hole 39 (see FIG. 2) formed in the pin block 30 of the socket 20. By fitting the positioning protrusion 76 and the positioning hole 39, the socket 20 is positioned at a predetermined position of the placement portion 75 in a predetermined posture.

At the center of the placement portion 75, two insertion pieces 77 are arranged side by side in the Y axis direction and protrude upward (in the Z axis positive direction). An upper end of the insertion piece 77 is inserted into the inner cavity 34 of the socket 20 fixed to the placement portion 75.

Figure 9:
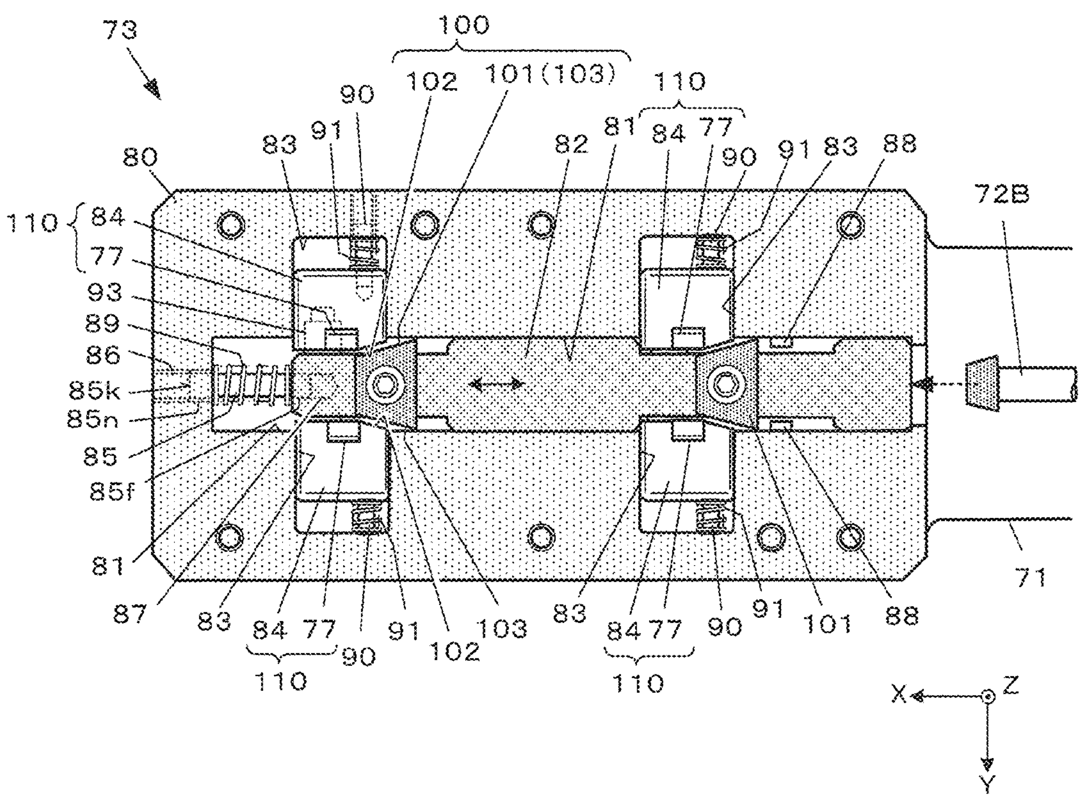
FIG. 9 is an internal structural view of the jig viewed from above.

FIG. 9 is a view showing an example of a structure of the disassembly mechanism portion 73, and is an internal structural view of the jig 70 as viewed from above. The disassembly mechanism portion 73 includes a main guide groove 81 that is recessed in a base portion 80 and that is long in the X axis direction, an actuating portion 82 that slides in the main guide groove 81 in a groove direction, a sub-guide groove 83 that is recessed in the Y axis direction in each of the placement portions 75, and an insertion piece support portion 84 that slides in the sub-guide groove 83 in the groove direction.

An adjustment pin 85 is provided upright along the groove direction on an inner wall portion of a front end portion (an X axis positive side end portion, that is, an end portion on a left side as viewed in FIG. 9) of the main guide groove 81. A male screw portion 85*n* is provided on an outer periphery of a front end portion of the adjustment pin 85. A front end surface 85*f* is provided with a tool engagement portion 85*k* (for example, a groove for engagement with a minus screwdriver) for engagement with a screwdriver tool.

The adjustment pin 85 is screwed into a female screw hole 86 of the base portion 80, and the dimension of the adjustment pin 85 to be inserted into the main guide groove 81 can be adjusted using the screwdriver tool. The X axis negative side of the adjustment pin 85 with respect to the male screw portion 85*n* forms a straight pin with no thread formed thereon, and a rear end (an X axis negative side end portion, that is, an end portion on a right side as viewed in FIG. 9) thereof is inserted into and brought into sliding contact with a pin sliding hole 87 formed in a front end of the actuating portion 82. When a tip of the adjustment pin 85 hits the bottom of the pin sliding hole 87, the forward movement of the actuating portion 82 is stopped there. That is, the adjustment pin 85 functions as a stop pin that adjustably determines the forward movement limit of the actuating portion 82.

However, the maximum forward movement limit of the actuating portion 82 itself is determined by a stopper 88 protruding from the main guide groove 81. The actuating portion 82 includes a portion whose width (lateral width) in the Y axis direction is narrowed, and the stopper 88 protrudes toward the narrowed portion of the actuating portion 82. The maximum forward movement limit is determined by an end of the narrowed portion of the actuating portion 82 hitting the stopper 88.

The adjustment pin 85 is also a support shaft for a coil spring 89. The coil spring 89 is provided between an inner wall of a front end of the main guide groove 81 and a front end side surface of the actuating portion 82, and generates a biasing force for pushing the actuating portion 82 back rearward (in the X axis negative direction).

A rear end portion (an X axis negative side end portion, that is, a right end portion in FIG. 9) of the main guide groove 81 opens to the outside while preventing the actuating portion 82 from coming off. The slide bar 72B of the toggle clamp 72 enters this opening, abuts against a rear end side surface of the actuating portion 82, and pushes the actuating portion 82 in the X axis positive direction.

One insertion piece support portion 84 is provided in each of the sub-guide groove 83 on the Y axis positive side and the sub-guide groove 83 on the Y axis negative side across the main guide groove 81. The insertion piece 77 (see FIG. 8) protrudes from an upper surface of the insertion piece support portion 84. The insertion piece support portion 84 constitutes a release portion 110 together with the insertion piece 77.

Each of the sub-guide grooves 83 includes, at the end thereof, a stop pin 90 that is screwed into the base portion 80 and that protrudes in the groove direction. An engagement portion that engages with the screwdriver tool is formed on an outer surface of the stop pin 90. The dimension by which a tip of the stop pin 90 protrudes into the sub-guide groove 83 can be adjusted using the screwdriver tool. With this adjustment of the dimension, the position of the movement limit of the insertion piece support portion 84 moving in a direction away from the actuating portion 82 is determined.

The stop pin 90 is also a support shaft for a coil spring 91. The coil spring 91 is a biasing portion that biases the insertion piece support portion 84 in a direction opposite to a direction (a direction in which the insertion piece support portion 84 moves away from the actuating portion 82) in which an actuating force of the toggle clamp 72 is converted. The coil spring 91 is provided between an outer side inner wall of the sub-guide groove 83 and an outer surface of the insertion piece support portion 84, and generates a biasing force for pushing the insertion piece support portion 84 back inward (in a direction approaching the actuating portion 82).

A stop bolt 93 is provided inside the insertion piece support portion 84 (on a side close to the actuating portion 82) in a manner of being insertable and removable in the groove direction of the sub-guide groove 83. A bolt head of the stop bolt 93 is exposed toward the actuating portion 82, and hits left and right outer surfaces of the actuating portion 82 when the insertion piece support portion 84 biased by the coil spring 91 slides toward the actuating portion 82. That is, the protrusion length of the stop bolt 93 from the insertion piece support portion 84 can be adjusted. The position of the movement limit of the insertion piece support portion 84 moving toward the actuating portion 82 is determined by the protrusion length.

The disassembly mechanism portion 73 includes a conversion mechanism 100. The conversion mechanism 100 is a mechanism that converts the actuating force of the toggle clamp 72 into a moving force in an opening direction in which the pair of insertion pieces 77 are separated from each other, and is implemented by engaging the actuating portion 82 and the insertion piece support portion 84 with a wedge structure. Specifically, the conversion mechanism 100 includes a wedge body 101 that moves integrally with the actuating portion 82, and an intersecting surface 102 that is provided on the insertion piece support portion 84.

The wedge body 101 is provided for each pair of placement portions 75 attached to the actuating portion 82, and has an outer shape in which the width in the Y axis direction linearly increases from a front end toward a rear end.

The intersecting surface 102 is a surface that faces an outer surface of the wedge body 101 in the Y axis direction and that intersects with the groove direction (the same as an opening and closing direction in which the two insertion pieces 77 open and close) of the sub-guide groove 83. That is, when the operation lever 72L is operated and the actuating portion 82 moves in the X axis positive direction, the outer surface (a slope 103 having a small slope and facing a direction that intersects with an actuating direction of the actuating portion 82) of the wedge body 101 in the Y axis direction becomes a pressing surface, and the outer surface presses while coming into sliding contact with the intersecting surface 102 of the insertion piece support portion 84. Accordingly, the pair of insertion pieces 77 protruding from the insertion piece support portion 84 move away from each other in the Y axis direction, and the two insertion pieces 77 are opened.

Next, the usage of the socket maintenance set 10 will be described.

The operator releases the operation lever 72L of the toggle clamp 72, and fits and fixes the socket 20 to be disassembled to the placement portion 75 of the jig 70. Specifically, with a lower surface of the socket 20 facing up and a longitudinal direction of the curved portion 36 aligned with a longitudinal direction of the jig 70, the positioning hole 39 of the socket 20 is fitted to the positioning protrusion 76 of the jig 70 and fixed.

Figure 10:
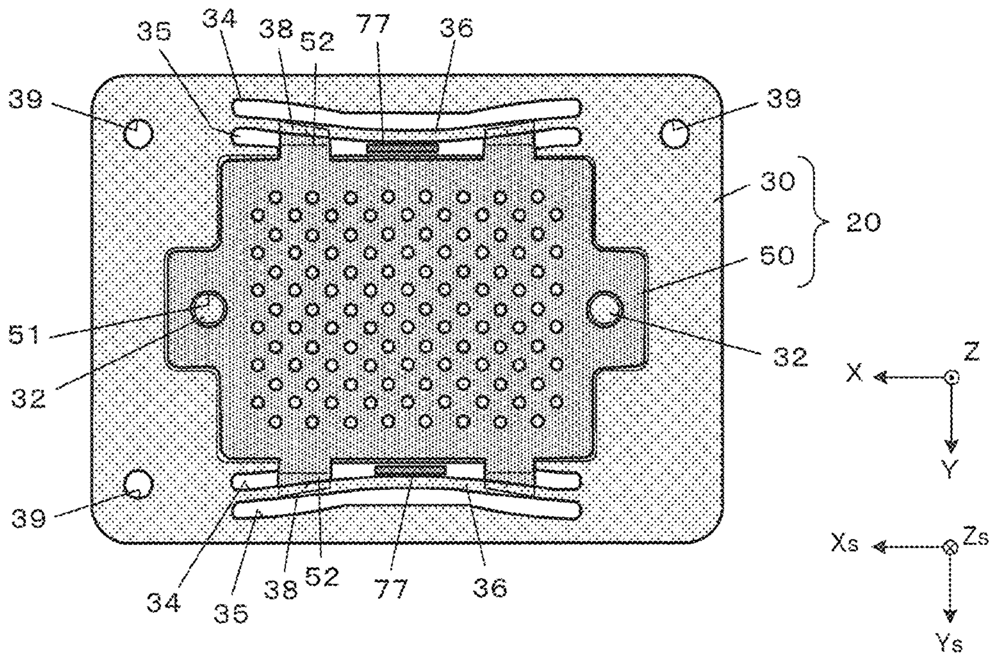
FIG. 10 is a view showing an example of a relative positional relationship between the socket placed and fixed on a placement portion and an insertion piece.

FIG. 10 is a view showing an example of a relative positional relationship between the socket 20 fixed to the placement portion 75 and the insertion piece 77, and is a view seen from directly above (on the Z axis positive side of) the jig 70.

As shown in FIG. 10, when the socket 20 is fixed to the placement portion 75, an upper end of the insertion piece 77 enters the inner cavity 34. The insertion piece 77 protrudes from the placement portion 75. Therefore, when the socket 20 is fixed to the placement portion 75, the socket 20 is brought close to the placement portion 75 so as to cover the placement portion 75 from above. First, the insertion piece 77 is placed inside the curved portion 36, and the insertion piece 77 abuts against the curved portion 36 (or a slight gap is present between the insertion piece 77 and the curved portion 36). Then, by pressing the socket 20 from above while maintaining this state, the positioning hole 39 of the socket 20 is fitted to the positioning protrusion 76 of the jig 70, and the pin block 30 in the engaged state is fixed to the placement portion 75.

Depending on the setting of the protrusion dimension of the insertion piece 77, the insertion piece 77 entering inside the curved portion 36 and the positioning hole 39 of the socket 20 being fitted to the positioning protrusion 76 of the jig 70 may be at the same time.

Next, the operator operates the operation lever 72L of the toggle clamp 72 in a release state to displace the insertion piece support portion 84 in the opening direction.

Figure 11:
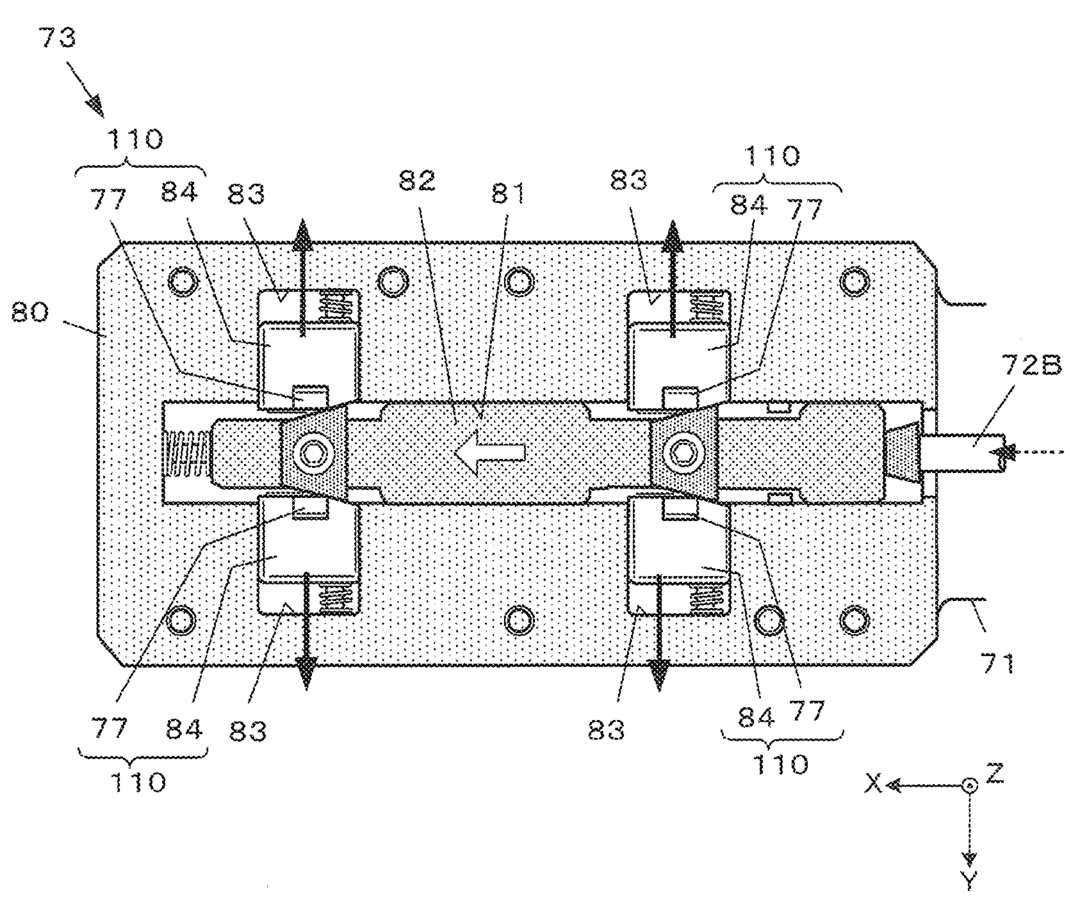
FIG. 11 is a view showing an operation of a disassembly mechanism portion when an operation lever is operated.

FIG. 11 is a view showing an operation of the disassembly mechanism portion 73 when the operation lever 72L is operated. When the operation lever 72L is operated, the slide bar 72B of the toggle clamp 72 slides toward the disassembly mechanism portion 73, and pushes the actuating portion 82 in the actuating direction (forward, the X axis positive direction, and the left in FIG. 11). The pushed actuating portion 82 moves in the actuating direction while being guided within the main guide groove 81. The wedge body 101 integrated with the actuating portion 82 also moves together, and the slope 103 abuts against the intersecting surface 102 of the insertion piece support portion 84 and pushes the intersecting surface 102 as the actuating portion 82 moves.

According to the wedge structure of the conversion mechanism 100, the slope 103 slides and pushes the intersecting surface 102, and the insertion piece support portion 84 is guided by the sub-guide groove 83 and pushed outward. That is, the actuating portion 82 actuates in a predetermined actuating direction (a direction of a thick white arrow in FIG. 11) based on the operation of the operation lever 72L, and converts the actuating force in the actuating direction into the opening direction (a direction of a thick black arrow drawn on each of the insertion piece support portions 84 in FIG. 11. The insertion piece support portion 84 on a right side with respect to the main guide groove 81 is converted into a right direction (the Y axis positive direction), and the insertion piece support portion 84 on a left side with respect to the main guide groove 81 is converted into a left direction (the Y axis negative direction)) to displace the insertion piece support portion 84. In other words, as the actuating portion 82 moves, the plurality of release portions 110 simultaneously move in the opening direction in a direction perpendicular to a moving direction of the actuating portion 82.

Figure 12:
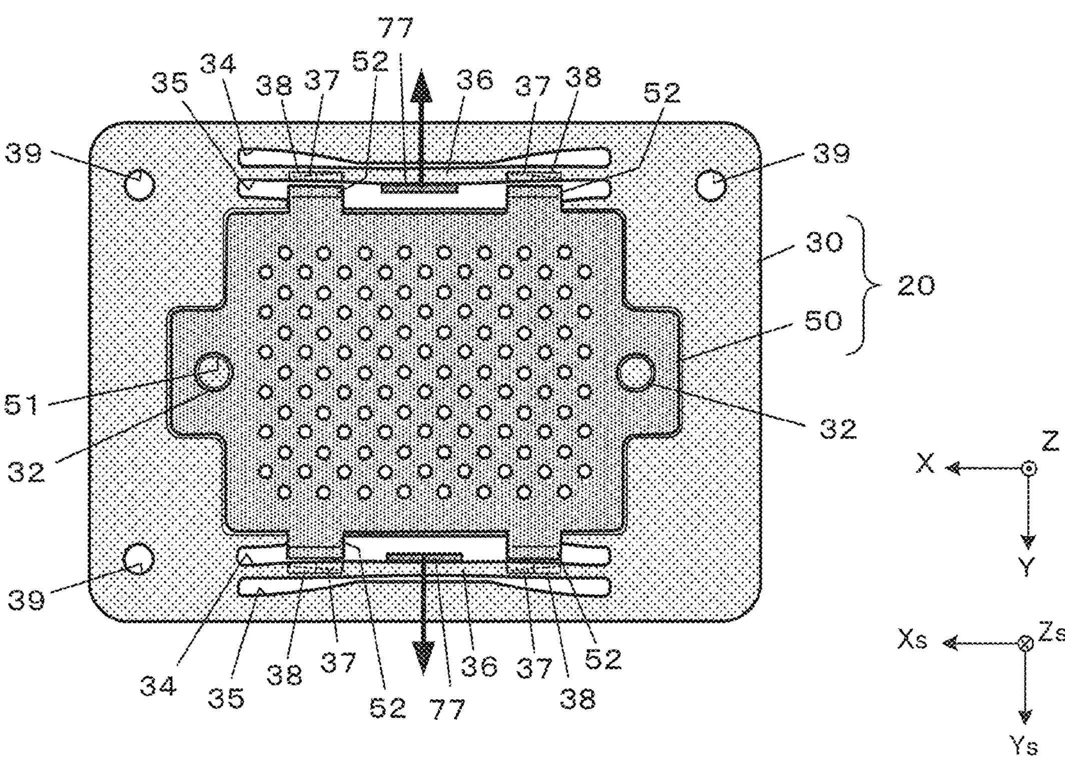
FIG. 12 is a view showing the socket and the insertion piece in a state in which an insertion piece support portion is displaced in an opening direction.

FIG. 12 is a view showing the socket 20 and the insertion piece 77 in a state in which the insertion piece support portion 84 is displaced in the opening direction, as viewed from directly above (on the Z axis positive side) the jig 70.

The insertion piece support portion 84 is displaced in the opening direction, so that the insertion piece 77 integrated with the insertion piece support portion 84 moves outward (in a direction of a thick black arrow in FIG. 12). Focusing on the relative positional relationship between the two insertion piece support portions 84 and the two insertion pieces 77, the two insertion piece support portions 84 and the two insertion pieces 77 open in the Y axis direction, and the insertion pieces 77 push the vicinity of the top of the convex apex of the arc of the curved portion 36 outward (a direction away from the center of the pin block 30, that is, a direction opposite to the convexity of the arc).

The curved portion 36 pushed by the insertion piece 77 is elastically deformed such that the arc becomes gentle. Due to this elastic deformation, the guide slope 38 and the engagement step portion 37 (see FIGS. 3 to 5) on an upper surface side (a back side in FIG. 12) of the guide slope 38 are also displaced outward.

Due to the displacement of the engagement step portion 37, the engagement step portion 37 separates from the engagement portion 52 of the pin plate 50, and as shown in FIG. 12, the engagement between the two is released. That is, the curved portion 36 is displaced, and a curved central portion of the curved portion 36 is displaced in a direction opposite to a convex direction of the curve, so that the engagement of the second structure portion 62 is released. Since the plurality of release portions 110 move simultaneously, the engaged states between the pin blocks 30 and the pin plates 50 in the plurality of sockets 20 are released almost simultaneously.

When the engagement of the second structure portion 62 is released, the operator can easily remove the pin plate 50 from the pin block 30 without damaging the pin plate 50 by picking the pin plate 50 up with tweezers or the like.

The socket 20 corresponding to the contact probe 23 having a small overall length is much thinner than a product in the related art and is likely to be damaged. When an attempt is made to remove the pin plate 50 from the pin block 30 without using the jig 70 in order to disassemble the socket 20, the second structure portion 62 is likely to be damaged. However, the curved portion 36 can be displaced by the jig 70, and the engagement of the second structure portion 62 can be released. Therefore, the pin plate 50 can be safely removed from the pin block 30.

The curved shape of the curved portion 36 and the triangular shape of the engagement step portion 37 significantly contribute to both reliable maintenance of the engagement and quick disassembly of the second structure portion 62.

That is, the curved portion 36 has an arc shape that is convex toward the center of the pin block 30, and the curved center portion is less likely to be displaced in the opposite direction of the curve than when the curved portion 36 is straight. This increases resistance to the deformation in the direction in which the engagement of the second structure portion 62 is released. Therefore, the engagement step portion 37 has a triangular shape, and the engagement step portion 37 is only slightly engaged with the corner of the engagement portion 52 of the pin plate 50. However, the engagement between the curved portion 36 and the engagement portion 52 is not easily released under a normal usage condition. On the other hand, when the curved portion 36 is displaced in the opposite direction of the curve via the jig 70, since the engagement step portion 37 has a triangular shape, the engagement between the curved portion 36 and the engagement portion 52 is quickly released.

Since one jig 70 is provided with the two placement portions 75 and structures related to the two insertion pieces 77 and the insertion piece support portion 84 corresponding to the placement portions 75, it is possible to support the disassembly of two sockets 20 using the jig 70 once. Therefore, the workability is excellent. When the overall length of the jig 70 in the X axis direction is increased and one jig 70 is provided with three or more sets of the placement portion 75, two insertion pieces 77, and two insertion piece support portions 84, the workability is further improved. Of course, a configuration is also possible in which one jig 70 is provided with only one set of the placement portion 75, two insertion pieces 77, and two insertion piece support portions 84.

SUMMARY

The disclosure of the present specification according to the embodiment described above can be summarized as follows.

An aspect of the present disclosure provides a socket including a pin block configured to hold a contact probe array, and a pin plate that removably engages with the pin block. The pin block includes a curved portion located outside the contact probe array and convex toward an inside of the contact probe array. The pin plate includes an engagement portion that engages with the curved portion convex toward the inside.

According to this aspect, engagement between the pin block and the pin plate can be achieved without using a screw. Since no screw is required, the socket can be made thinner accordingly. Therefore, it is possible to provide a socket that is thinner than a socket in the related art and that corresponds to a contact probe having a small overall length.

The curved portion may be deformable in a direction along a plane of the pin block.

An engaged state of the engagement portion may be released by deforming the curved portion in the direction along a plane of the pin block.

The curved portion may include an engagement step portion that engages with the engagement portion.

The engagement step portion may be located at two locations sandwiching an innermost location of the pin block in the curved portion.

Accordingly, the engagement is strengthened by providing a plurality of engagement locations.

The curved portion may have a guide slope configured to guide the engagement portion to the engagement step portion.

Accordingly, for example, the establishment of the engagement can be assisted in a socket assembly process for attaching the pin plate to the pin block.

The engagement step portion may have a triangular shape.

Accordingly, by forming the engagement portion between the pin block and the pin plate into the triangular shape, it is possible to achieve both the function of maintaining the engagement and the quick engagement release.

Another aspect provides a jig for releasing an engaged state of a socket including a pin block and a pin plate that removably engages with the pin block. The jig includes a placement portion configured to place the socket in which the pin block and the pin plate are in the engaged state, an insertion piece that abuts against an engagement portion between the pin block and the pin plate an insertion piece support portion configured to support the insertion piece such that the insertion piece is displaceable in a predetermined opening and closing direction, and an actuating portion movable in a predetermined moving direction along a plane of the socket. The actuating portion comes into contact with the insertion piece support portion and converts a moving force in the moving direction into the opening and closing direction to displace the insertion piece. The insertion piece releases the engaged state by the displacement.

Still another aspect provides a release method including: a step of placing a socket in which a pin block and a pin plate are in an engaged state; a step of moving (a first moving), in a predetermined moving direction along a plane of the socket, an actuating portion configured to actuate by operating an operation lever; a step of moving (a second moving) a release portion configured to release the engaged state in a direction perpendicular to the predetermined moving direction by the movement of the actuating portion; and a step of releasing the engaged state between the pin block and the pin plate by the movement of the release portion.

In the release method, the step of placing the socket may be a step of placing a plurality of the sockets, the step of moving (the second moving) the release portion may be a step of moving a plurality of the release portions corresponding to the plurality of sockets, and the step of releasing the engaged state may be a step of releasing the engaged states of the plurality of sockets almost simultaneously by the movement of the plurality of release portions.

Accordingly, it is possible to assist safe disassembly of the socket that is thin and that is likely to be damaged. Good workability can be achieved in disassembling and assembling the pin block and pin plate when removing and replacing the contact probe from the socket.

The insertion piece support portion may have an intersecting surface that intersects the opening and closing direction as a contact surface that comes into contact with the actuating portion, and the actuating portion may have a wedge structure having a slope that comes into contact with the contact surface.

Accordingly, it is possible to implement a mechanism that converts the operation of the actuating portion into the operation of moving the insertion piece support portion and the insertion piece in the opening direction with a simple structure.

The jig may further include: a plurality of sets each including the placement portion, the insertion piece, and the insertion piece support portion; and one actuating portion. The actuating portion may have the wedge structure corresponding to each of the sets.

Accordingly, it is possible to assist the disassembly of the plurality of sockets at once, resulting in excellent workability.

The jig may further include a biasing portion configured to bias the insertion piece support portion in a direction opposite to a direction in which the moving force is converted by the actuating portion.

Accordingly, since the actuating portion can be returned to an original position by the action of the biasing portion, the workability when performing a continuous disassembly operation is improved.

Still another aspect provides a socket maintenance set including the socket and the jig.

REFERENCE SIGNS LIST

- 10 socket maintenance set
- 20 socket
- 21 contact probe array
- 23 contact probe
- 30 pin block
- 32 positioning pin
- 33 pin block side insertion portion
- 34 inner cavity
- 35 outer cavity
- 36 curved portion
- 37 engagement step portion
- 38 guide slope
- 39 positioning hole
- 50 pin plate
- 51 positioning hole

52 engagement portion
53 pin plate side insertion portion
60 mutual engagement structure
61 first structure portion
62 second structure portion
70 jig
72 toggle clamp
72L operation lever
73 disassembly mechanism portion
75 placement portion
77 insertion piece
82 actuating portion
84 insertion piece support portion
100 conversion mechanism
101 wedge body
102 intersecting surface
103 slope
110 release portion

The invention claimed is:

1. A socket comprising:

a pin block configured to hold a contact probe array; and a pin plate that removably engages with the pin block, wherein the pin block includes a curved portion located outside the contact probe array and convex toward an inside of the contact probe array, wherein the pin plate includes an engagement portion that engages with the curved portion convex toward the inside, and wherein the curved portion is deformable in a direction along a plane of the pin block.

2. The socket according to claim 1, wherein an engaged state of the engagement portion is released by deforming the curved portion in the direction along the plane of the pin block.

3. The socket according to claim 1, wherein the curved portion includes an engagement step portion that engages with the engagement portion.

4. The socket according to claim 3, wherein the engagement step portion is located at two locations sandwiching an innermost location of the pin block in the curved portion.

5. The socket according to claim 3, wherein the curved portion has a guide slope configured to guide the engagement portion to the engagement step portion.

6. The socket according to claim 3, wherein the engagement step portion has a triangular shape.

7. A jig for releasing an engaged state of a socket including a pin block and a pin plate that removably engages with the pin block, the jig comprising:

a placement portion configured to place the socket in which the pin block and the pin plate are in the engaged state;

an insertion piece that abuts against an engagement portion between the pin block and the pin plate;

an insertion piece support portion configured to support the insertion piece such that the insertion piece is displaceable in a predetermined opening and closing direction; and an actuating portion movable in a predetermined moving direction along a plane of the socket, wherein the actuating portion comes into contact with the insertion piece support portion and converts a moving force in the moving direction into the opening and closing direction to displace the insertion piece, and wherein the insertion piece releases the engaged state by the displacement.

8. The jig according to claim 7, wherein the insertion piece support portion has an intersecting surface that intersects the opening and closing direction as a contact surface that comes into contact with the actuating portion, and wherein the actuating portion has a wedge structure having a slope that comes into contact with the contact surface.

9. The jig according to claim 8, further comprising:

a plurality of sets each including the placement portion, the insertion piece, and the insertion piece support portion; and one actuating portion, wherein the actuating portion has the wedge structure corresponding to each of the sets.

10. The jig according to claim 7, further comprising:

a biasing portion configured to bias the insertion piece support portion in a direction opposite to a direction in which the moving force is converted by the actuating portion.

11. A socket maintenance set comprising:

a socket comprising a pin block configured to hold a contact probe array, and a pin plate that removably engages with the pin block, wherein the pin block includes a curved portion located outside the contact probe array and convex toward an inside of the contact probe array, and wherein the pin plate includes an engagement portion that engages with the curved portion convex toward the inside; and a jig for releasing an engaged state of the socket, the jig comprising a placement portion configured to place the socket in which the pin block and the pin plate are in the engaged state, an insertion piece that abuts against the engagement portion between the pin block and the pin plate, an insertion piece support portion configured to support the insertion piece such that the insertion piece is displaceable in a predetermined opening and closing direction, and an actuating portion movable in a predetermined moving direction along a plane of the socket, wherein the actuating portion comes into contact with the insertion piece support portion and converts a moving force in the moving direction into the opening and closing direction to displace the insertion piece, and wherein the insertion piece releases the engaged state by the displacement.

12. A release method comprising:

placing a socket in which a pin block and a pin plate are in an engaged state;

a first moving, in a predetermined moving direction along a plane of the socket, of an actuating portion configured to actuate by operating an operation lever;

a second moving of a release portion configured to release the engaged state in a direction perpendicular to the predetermined moving direction by the movement of the actuating portion; and releasing the engaged state between the pin block and the pin plate by the movement of the release portion.

13. The release method according to claim 12, wherein the placing includes placing a plurality of the sockets, wherein the second moving includes moving a plurality of the release portions corresponding to the plurality of sockets, and wherein the releasing includes releasing the engaged states of the plurality of sockets almost simultaneously by the movement of the plurality of release portions.

* * * * *